United States Patent
Neal et al.

(10) Patent No.: US 8,951,350 B2
(45) Date of Patent: Feb. 10, 2015

(54) COATING METHODS AND APPARATUS

(75) Inventors: James W. Neal, Ellington, CT (US); Kevin W. Schlichting, South Glastonbury, CT (US); Peter F. Gero, Portland, CT (US)

(73) Assignee: United Technologies Corporation, Hartford, CT (US)

( * ) Notice: Subject to any disclaimer, the term of this patent is extended or adjusted under 35 U.S.C. 154(b) by 953 days.

(21) Appl. No.: 13/099,635

(22) Filed: May 3, 2011

(65) Prior Publication Data

US 2012/0282402 A1 Nov. 8, 2012

(51) Int. Cl.
| | |
|---|---|
| C23C 16/00 | (2006.01) |
| C23C 14/30 | (2006.01) |
| C23C 14/50 | (2006.01) |
| C23C 14/54 | (2006.01) |
| C23C 14/56 | (2006.01) |

(52) U.S. Cl.
CPC ............... *C23C 14/30* (2013.01); *C23C 14/50* (2013.01); *C23C 14/541* (2013.01); *C23C 14/564* (2013.01)
USPC ............ 118/726; 118/727; 118/729; 118/730

(58) Field of Classification Search
CPC .......... C23C 16/00; C23C 16/46; C23C 16/50
USPC .................................. 118/726, 727, 729, 730
See application file for complete search history.

(56) References Cited

U.S. PATENT DOCUMENTS

| | | | |
|---|---|---|---|
| 3,690,635 A | 9/1972 | Harker | |
| 4,184,448 A * | 1/1980 | Aichert et al. ................ | 118/729 |
| 4,405,659 A | 9/1983 | Strangman | |
| 5,065,698 A | 11/1991 | Koike | |
| 5,366,764 A * | 11/1994 | Sunthankar ................ | 427/248.1 |
| 6,060,177 A | 5/2000 | Bornstein et al. | |
| 2004/0018303 A1* | 1/2004 | Bruce et al. ................ | 427/248.1 |
| 2009/0017217 A1 | 1/2009 | Hass et al. | |
| 2010/0047474 A1 | 2/2010 | Neal et al. | |
| 2010/0068417 A1 | 3/2010 | Neal et al. | |
| 2010/0104766 A1 | 4/2010 | Neal et al. | |
| 2010/0242841 A1 | 9/2010 | Neal | |
| 2010/0247809 A1 | 9/2010 | Neal | |

FOREIGN PATENT DOCUMENTS

WO 2011/066532 A2 6/2011

OTHER PUBLICATIONS

Partial European Search Report for European Patent Application No. 12162652.7. dated Jul. 9, 2012.
Search Report and Written Opinion for European Patent Application No. 12162652.7, dated Sep. 19, 2012.

* cited by examiner

*Primary Examiner* — Keath Chen
(74) *Attorney, Agent, or Firm* — Bachman & LaPointe, P.C.

(57) ABSTRACT

An apparatus deposits a coating on a part. The apparatus comprises a chamber and a sting assembly for carrying the part. The sting assembly is shiftable between: an inserted condition where the sting assembly holds the part within the chamber for coating; and a retracted condition where the sting assembly holds the part outside of the chamber. The apparatus comprises a source of the coating material positioned to communicate the coating material to the part in the inserted condition. The apparatus comprises a thermal hood comprising a first member and a second member. The second member is between the first member and the part when the part is in the inserted condition. The second member is carried by the sting assembly so as to retract with the sting assembly as the sting assembly is retracted from the inserted condition to the retracted condition.

20 Claims, 8 Drawing Sheets

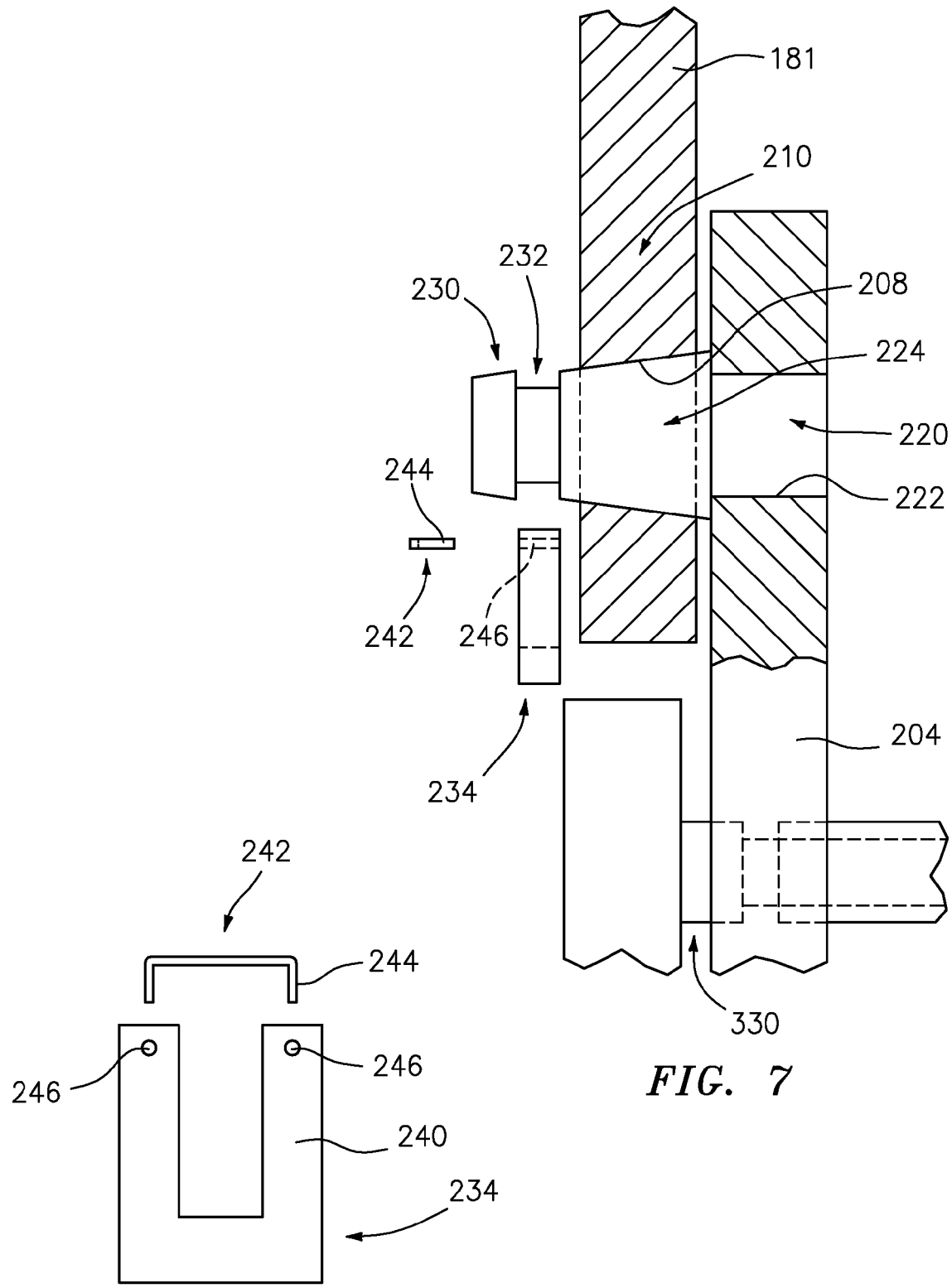

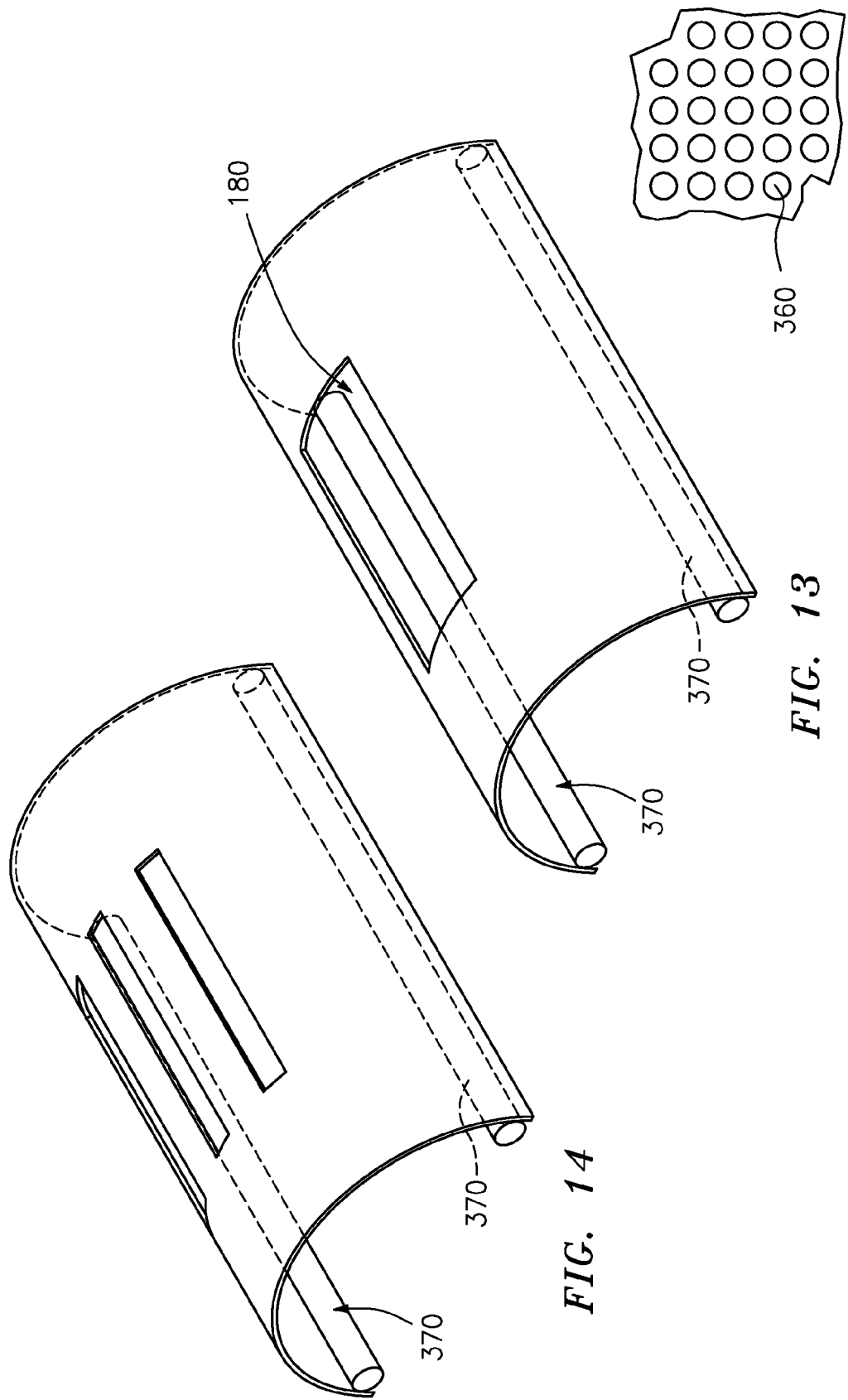

COATING METHODS AND APPARATUS

BACKGROUND

The disclosure relates to coating apparatus and methods. More particularly, the disclosure relates to application of thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes a NiCoCrAlY bond coat (e.g., low pressure plasma sprayed (LPPS)) and a yttria-stabilized zirconia (YSZ) thermal barrier coat (TBC) (e.g., air plasma sprayed (APS)). While the TBC layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Exemplary TBCs are applied to thicknesses of 5-40 mils (127-1016 micrometer) and can provide in excess of 300° F. temperature reduction to the base metal. This temperature reduction translates into improved part durability, higher turbine operating temperatures, and improved turbine efficiency.

Examples of coating apparatus are found in US Pre-grant Publication 2010/0047474 and PCT/US10/58319 which disclose use of thermal hoods to maintain part temperature.

SUMMARY

One aspect of the disclosure involves an apparatus for depositing a coating on a part. The apparatus comprises a chamber and a sting assembly for carrying the part. The sting assembly is shiftable between: an inserted condition where the sting assembly holds the part within the chamber for coating; and a retracted condition where the sting assembly holds the part outside of the chamber. The apparatus comprises a source of the coating material positioned to communicate the coating material to the part in the inserted condition. The apparatus comprises a thermal hood comprising a first member and a second member. The second member is between the first member and the part when the part is in the inserted condition. The second member is carried by the sting assembly so as to retract with the sting assembly as the sting assembly is retracted from the inserted condition to the retracted condition.

In various implementations, the source may comprise an ingot and an electron beam source positioned to direct a beam to the ingot. The first member and second member may be concentric shells. The first member may be mounted to the chamber so as to remain stationary as the sting assembly is moved between the retracted condition and the inserted condition. The first member may comprise a nickel-based superalloy and the second member may comprise a nickel-based superalloy. The first member may comprise a bent sheet and the second member may comprise a perforated bent sheet. The sting assembly may comprise an inner member and an outer member. An actuator may be coupled to the inner member to move the inner member relative to the outer member. The part may be held by the inner member and the thermal hood second member may be held by the outer member. The actuator may be coupled to the inner member to rotate the inner member relative to the outer member.

The sting assembly may have first and second gas flow-paths respectively coupled to an oxygen source and a scattering gas source.

Further aspects of the disclosure involve methods for using the apparatus. An exemplary method involves coating a first said part (which may be one of a group of first said parts). After the coating, the sting assembly is retracted from the inserted condition to the retracted condition to retract the first part from the chamber. The first part is replaced with a second said part (which may be one of a group of second said parts). The thermal hood second member is replaced with a replacement thermal hood second member. The second part and the replacement thermal hood second member are inserted to the chamber. The second part is coated.

In various implementations, the thermal hood first member may remain in place in the chamber during the coating of the first part and the coating of the second part. The chamber may be a deposition chamber and the apparatus may further comprise: a loading chamber; and a preheat chamber between the deposition chamber and the loading chamber. The retracting may comprise retracting the first part into the loading chamber through the preheat chamber. During the coating, the part being coated may be rotated relative to the thermal hood second member. The coating may pass to the part being coated as a vapor.

BRIEF DESCRIPTION OF THE DRAWINGS

FIG. 7 is an enlarged partially schematic view of a hood mounting arrangement for the carrier of FIG. 6.

FIG. 8 is an end view of a clip of the mounting arrangement of FIG. 7.

FIG. 12 is a partial view of perforations in the inner hood member.

FIG. 13 is a partially schematic view of an outer hood member.

FIG. 14 is a partially schematic view of an alternate outer hood member.

Like reference numbers and designations in the various drawings indicate like elements.

DETAILED DESCRIPTION

Figures 1, 2:
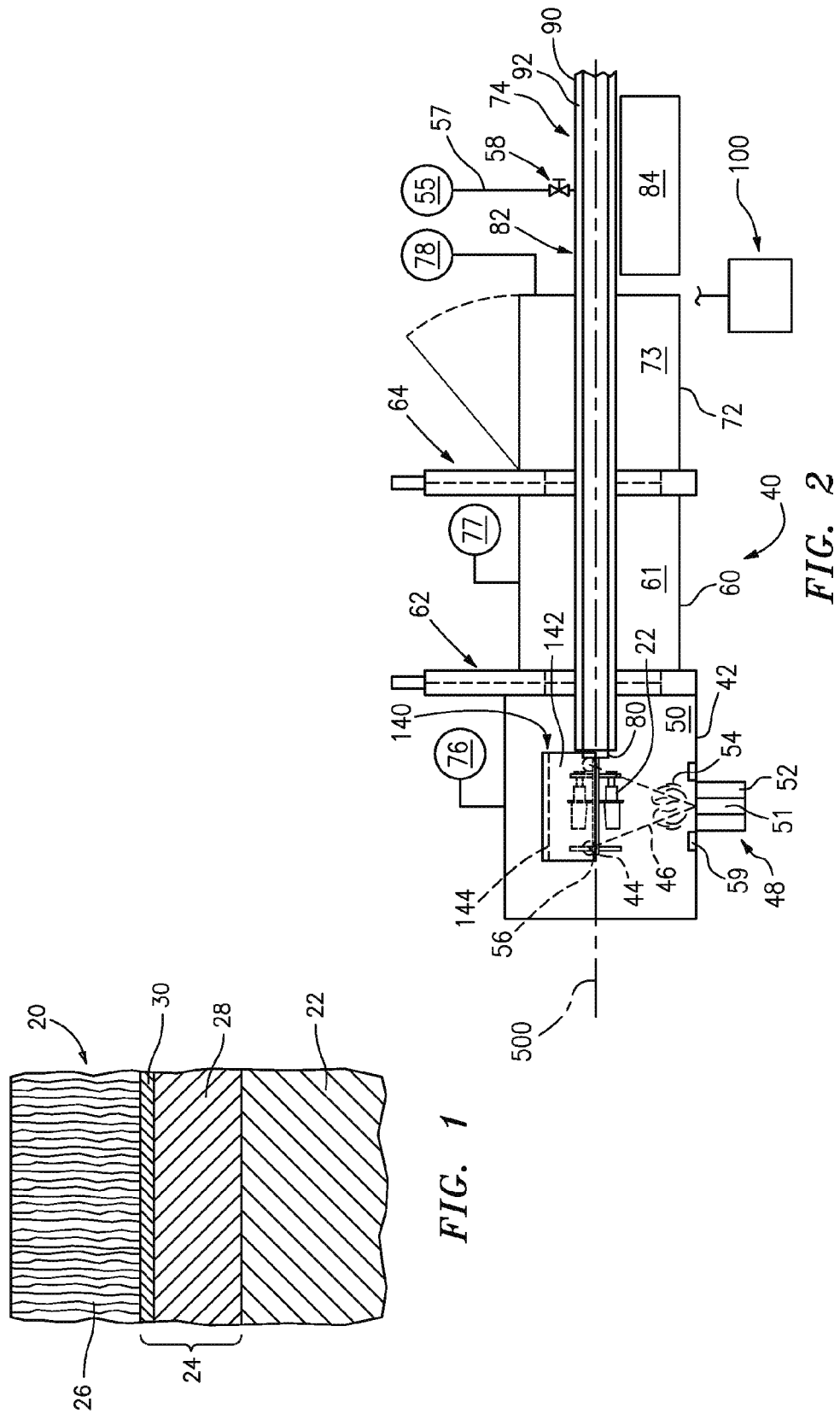
FIG. 1 is a partial schematic sectional view of a coated article.
FIG. 2 is a partially schematic side/cutaway view of a coating apparatus with fully inserted substrate carrier.

FIG. 1 shows a coating system 20 atop a superalloy substrate (the article/component/part that is coated) 22. The system may include a bond coat 24 atop the substrate 22 and a TBC 26 atop the bond coat 24. The exemplary bond coat 24 includes a base layer 28 and a TGO layer 30. Exemplary substrates are of nickel- or cobalt-based superalloys used for hot gaspath components such as: turbine section blades; turbine section vanes; turbine section blade outer air seals; combustor shell pieces; combustor heat shield pieces; combustor fuel nozzles; and combustor fuel nozzle guides. Exemplary base layer thicknesses are 10-400 micrometers, more narrowly 20-200 micrometers. Exemplary TGO layer thicknesses are 0.05-1 micrometers, more narrowly 0.1-0.5 micrometers. Exemplary TBC thicknesses are 40-800 micrometers, more narrowly 100-500 micrometers.

An exemplary coating process includes preparing the substrate (e.g., by cleaning and surface treating). A precursor of the bond coat is applied. An exemplary application is of an MCrAlY, more particularly a NiCoCrAlY material. An exemplary application is via a spray from a powder source. An exemplary application is via a low pressure plasma-spray (LPPS) process. An exemplary application is to a thickness of 0.003-0.010 inch, (76-254 micrometers) more broadly 0.001-0.015 inch (25-381 micrometers). LPPS, VPS, EBPVD, cathodic arc, cold spray, and any other appropriate process may be used.

After the application, the precursor may be diffused. An exemplary diffusion is via heating (e.g., to at least 1900° F. (1038 C) for a duration of at least 4 hours) in vacuum or nonreactive (e.g., argon) atmosphere. The exemplary diffusion may create a metallurgical bond between the bond coat and the substrate. Alternatively diffusion steps may occur after applying the TBC, if at all.

After application of the bond coat precursor, if any, the substrate may be transferred to a coating apparatus for applying the TBC 26. An exemplary coating apparatus is an EB-PVD coater. FIG. 2 shows one exemplary EB-PVD coating apparatus/system (coater) 40. The exemplary coater 40 includes a deposition or coating chamber 42. One or more electron guns 44 are positioned at the chamber to each direct an associated electron beam 46 to a deposition material (or precursor thereof) source 48 in the chamber interior 50. Exemplary material sources 48 comprise respective bodies (e.g., ingots) 51 of ceramic-forming material each in an associated crucible 52. The exemplary material sources are ceramic bodies of the nominal TBC composition (e.g., a yttria-stabilized zirconia or a gadolinia-zirconia such as 7 YSZ or 59 wt. % gadolinia, respectively). The electron beams vaporize the material to form vapor clouds or plumes 54 which envelop the articles or components 22 which are held in a coating position within the chamber 50. For introducing a reactive gas (e.g., oxygen for combining with the initially vaporated material in the vapor clouds to make up for oxygen lost from the evaporated ceramic) a gas source 55 may be provided. Exemplary gas is essentially pure oxygen. The source may be connected to an outlet (e.g., a manifold 56) via a gas line 57 and controlled by a gas valve 58. As is discussed further below, the same electron guns that vaporize the deposition material may be used to heat the coating chamber (e.g., by directing their beams to a bed 59 of refractory ceramic gravel (e.g., also 7 YSZ)). This may provide a preheating of the deposition chamber (e.g., both before any coating runs and between coating runs).

For preheating the parts, the exemplary system 40 includes a preheat chamber (preheater) 60 (having an interior 61) positioned on a side of the chamber 42. Even in the absence of preheating, such a chamber may serve merely as a transfer chamber between the deposition chamber and a loading chamber discussed below. A gate valve 62 may be positioned at a proximal end of the preheat chamber (i.e., between the preheat chamber interior and the deposition chamber interior). An additional gate valve 64 may be at a distal end of the preheat chamber. The preheat chamber is associated with a loading chamber or station 72 (load lock, having an interior 73). The valve 64 is thus between interiors of the preheat chamber and the loading chamber. Each of the valves 64 may, instead, be replaced by multiple valves so as to allow further isolation and allow various alternative couplings of multiple loading chambers and/or multiple preheat chambers. For example, one exemplary such coupling is shown in PCT/US10/58319. The exemplary loading station 72 may have a carrier and drive system/mechanism 74 which, when the appropriate gate valves are open, shift the carried articles into the preheat chamber 60 or all the way into the coating chamber 42. FIG. 2 also shows vacuum sources 76, 77, and 78, respectively, coupled to and associated with the chambers 42, 60, and 72. The exemplary vacuum sources are one or more pumps with associated conduits and valves. Various further options exist for further process gas sources (not shown).

An exemplary carrier and drive system/mechanism may comprise a part carrier/fixture 80 holding the parts 22 at one end of a sting assembly (sting) 82. A drive mechanism (actuator) 84 may drive the sting assembly. The drive mechanism may have a screw drive mechanism (e.g., electric motor driven) for longitudinally shifting the sting and carrier in the associated loading station. Each carrier carries an associated group of the articles. The carrier may rotate (e.g., about a longitudinal horizontal axis 500). The drive mechanism may include one or more additional appropriate mechanisms (actuators) (e.g., also electric motors) for driving such rotation. For example, the sting 82 may comprise an outer member 90 and an inner member 92 partially concentrically within the outer member 90. The drive mechanism may be mounted to the outer member to longitudinally shift the outer member (and thereby the carrier and inner member). The drive mechanism may also rotate the inner member relative to the outer member about the axis 500. The carrier may be mounted at an inboard end of the inner member 92.

A control system 100 may include an appropriately configured microcomputer, microcontroller, or other controller being configured by software and/or hardware to perform the methods described herein. The control system may be coupled to the various controllable system components as well as to sensors, input devices for receiving user input, and display devices.

Figure 3:
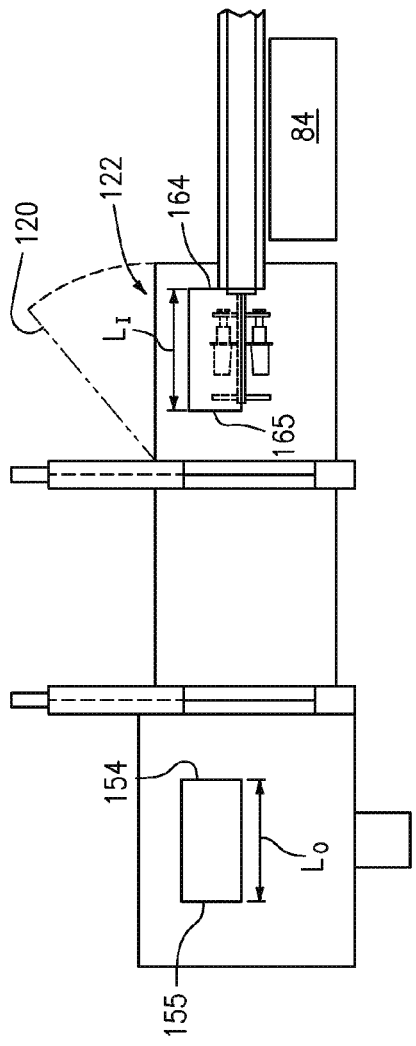
FIG. 3 is a view of the apparatus of FIG. 2 with fully retracted carrier.
Figure 4:
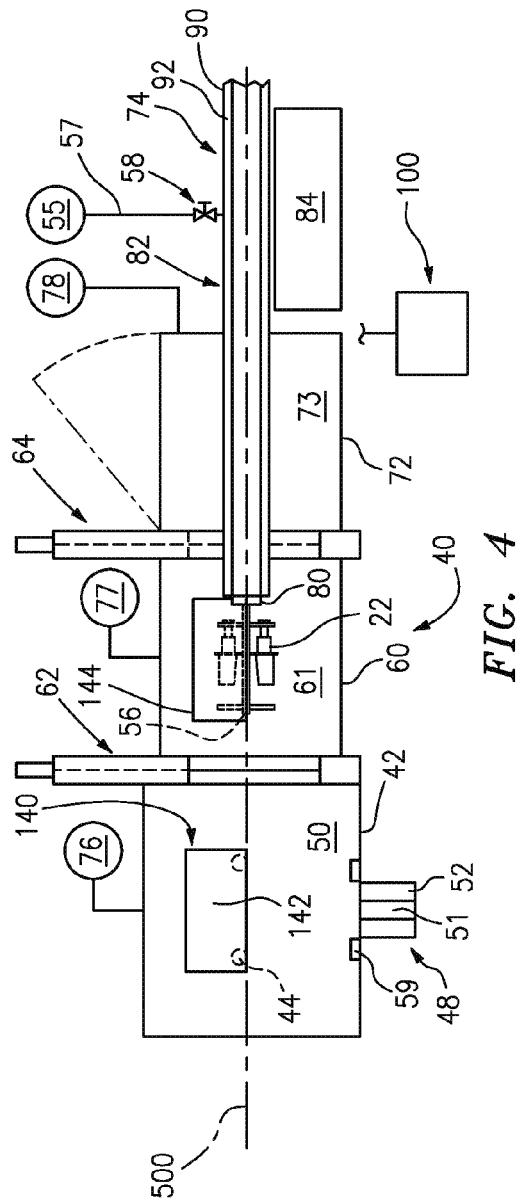
FIG. 4 is a view of the apparatus of FIG. 2 with intermediate position carrier.

FIG. 3 shows a maximally retracted second position of the sting assembly 74. In this condition, the carrier and parts are in the loading chamber 72 and may be accessed via one or more doors 120. For purposes of schematic illustration, the exemplary door 120 is shown positioned to close an opening or port 122 at the top of the chamber. However, such doors may alternatively be positioned at one or both sides of the chamber or even below. In the second position, the uncoated articles may be loaded into the loading station and the coated articles removed therefrom (e.g., through the associated port 122 (if present) or gate valve). FIG. 4 shows an intermediate third position with the carrier and parts in the preheat chamber 60.

FIG. 2 also shows a thermal hood combination 140 having an outer member (outer hood) 142 and an inner member (liner or inner hood) 144. FIG. 3 shows that the inner member may be mounted to the sting assembly to be retractable along with the parts. The exemplary outer member 142 is fixed in the coating chamber 42. The thermal hood may serve to maintain the effective coating temperature surrounding the parts during their coating process.

In operation, a thermal hood is subject to coating by the deposition material. This may degrade performance of the thermal hood or cause coating defects due to ceramic building up and flaking off and landing on the part(s). Performance degradation can eventually necessitate removal and replacement of the thermal hood. This may be a cumbersome process with prior art hoods. The exemplary inner member 144 effectively forms a liner representing but a portion of the total thermal mass of the hood (e.g., less than half). As is discussed further below, an exemplary inner member 144 may be formed from bent, perforated sheetstock of a nickel-based superalloy. The outer member 142 may represent a thicker, relatively less perforated, piece of a similar alloy.

Figure 5:
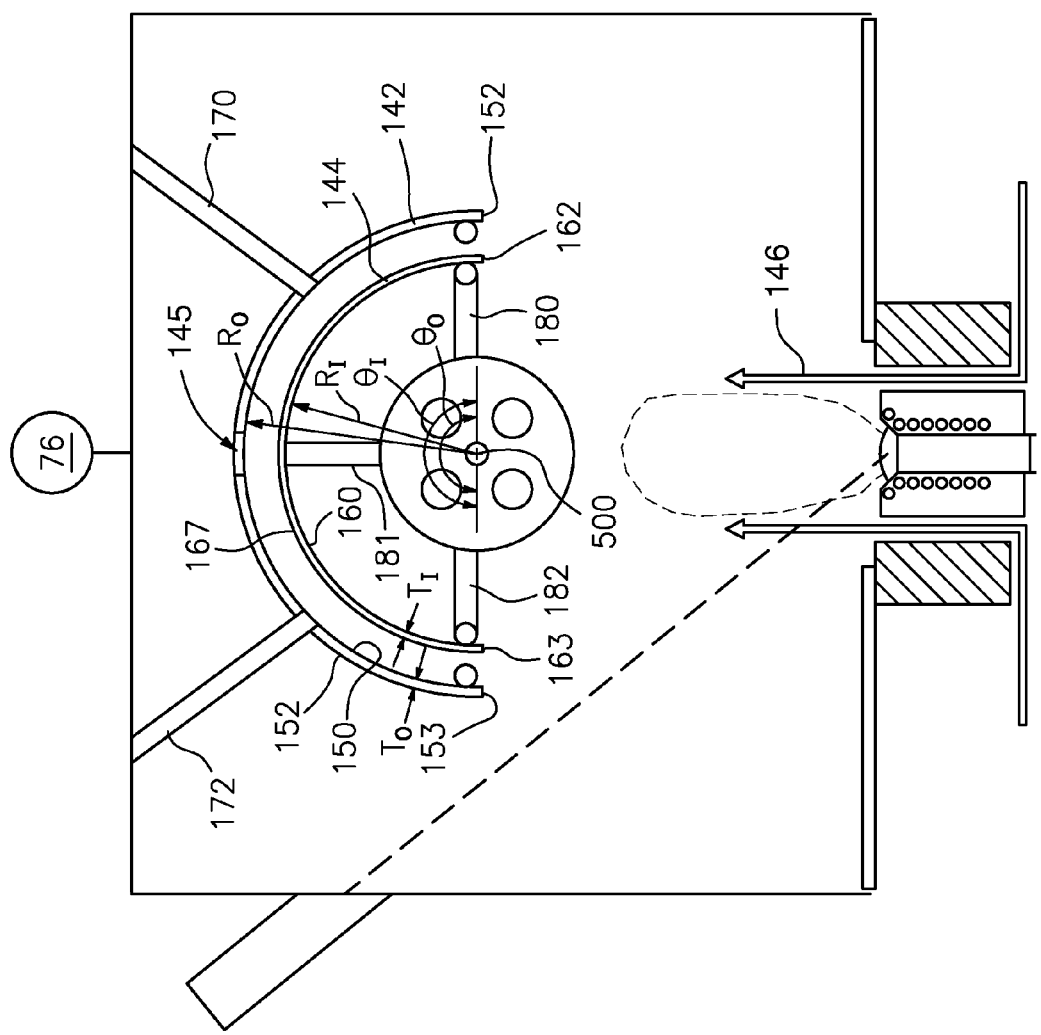
FIG. 5 is a partially schematic transverse sectional view of a deposition chamber of the apparatus of FIG. 2.

FIG. 5 shows further details of an exemplary hood configuration. The exemplary inner and outer members 144 and 142, respectively, are shaped as sectors of circular cylindrical shells. Exemplary sectors extend approximately halfway around the axis 500 by angles $\theta_I$ for the inner shell and $\theta_O$ for the outer shell. Exemplary $\theta_I$ and $\theta_O$ are 100°-200° about the axis 500, more narrowly, 160°-200° or 170°-190°. Exemplary hood layers/shells have respective lengths $L_I$ and $L_O$ (FIG. 3). Exemplary shells have radii $R_I$ and $R_O$. Exemplary $L_I$ and $L_O$ are greater than $R_I$ and $R_O$. Exemplary $R_I$ and $R_O$ may be measured at inboard surfaces. Exemplary $L_I$ and $L_O$ are within about 10% of each other. Exemplary $L_I$ and $L_O$ are 0.5-0.75 m, more narrowly, 0.6-0.65 m. Exemplary $R_I$ may be at least 75% of $R_O$, more narrowly, at least 85%. Exemplary $R_I$ and $R_O$ are 0.15-0.35 m, more narrowly, 0.18-0.28 m. As is discussed further below, the exemplary hood outer member 142 may have one or more slots 145. The slots may serve to guide gas flow out the top of the hood so as to provide desired exposure of the parts to the vapor plume. FIG. 5 also shows a carrier gas flow 146 (e.g., inert) for collimating the plume.

The exemplary outer member 142 has respective inner/inboard and outer/outboard surfaces 150 and 151, edges 152 and 153, and ends (FIG. 3) 154 and 155. Similarly, the inner member 144 has an inner/inboard surface 160, an outer/outboard surface 161, edges 162 and 163 and ends 164 and 165. Respective shell thicknesses between the inboard and outboard surfaces are $T_O$ and $T_I$. These, as well as the other parameters, may be measured by an appropriate average (e.g., either mean, median, or modal). Exemplary $T_O$ is 2.5-8 mm, more narrowly, 5-6.5 mm. Exemplary $T_I$ is 2.5-8 mm, more narrowly, 3-5 mm.

Proximate the end 164, the inner hood 144 is supported relative to the sting assembly via struts 180, 181, and 182. Exemplary struts 180 and 182 are respectively near the edges 162 and 163. The exemplary outer hood 142 is supported relative to the chamber via struts 170, 172. The outer hood 142 may be removable (such as via unbolting).

Figure 6:
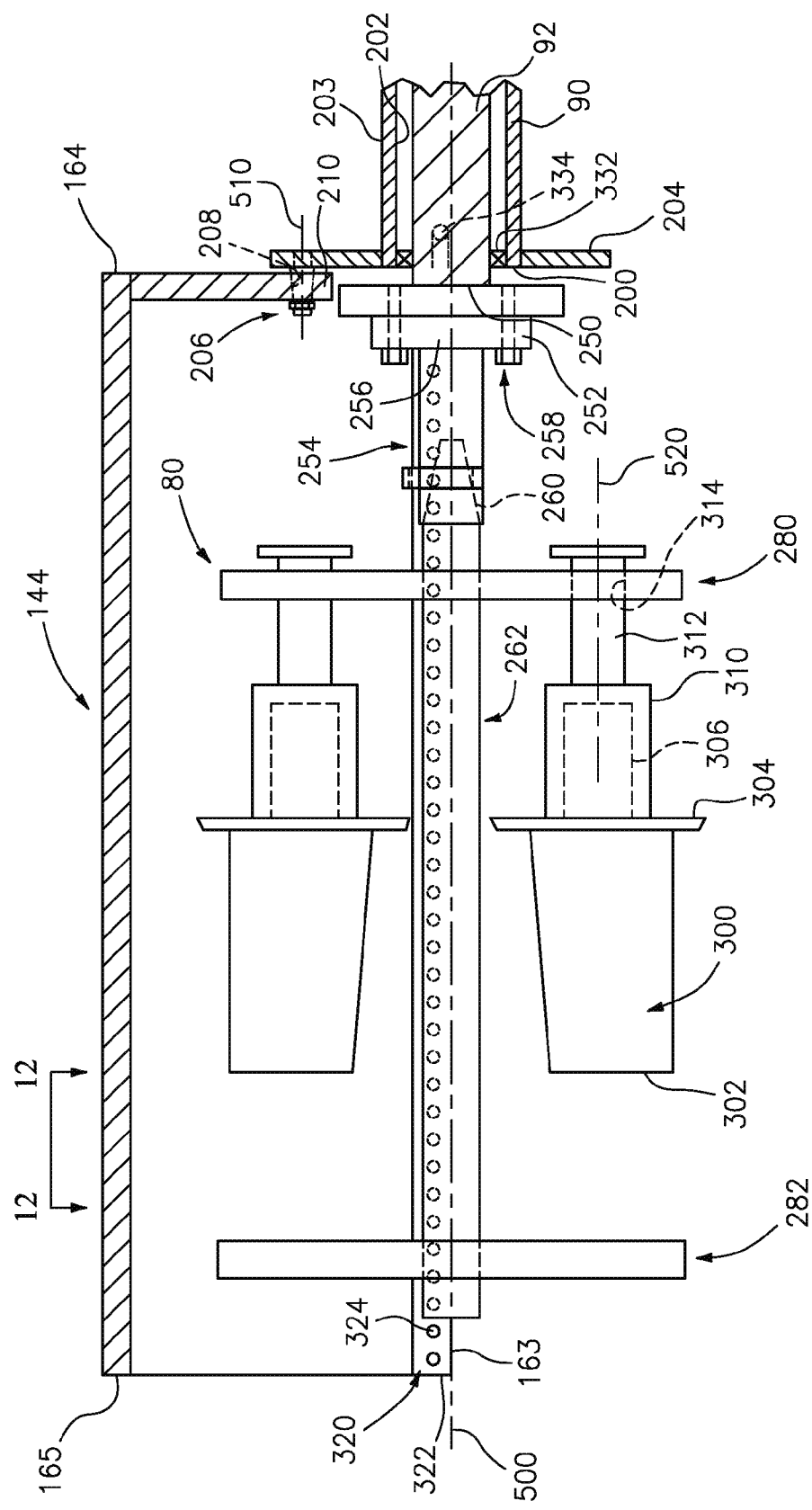
FIG. 6 is a partial, partially schematic, longitudinal cut-away/sectional view of the carrier of the apparatus of FIG. 2.
Figure 11:
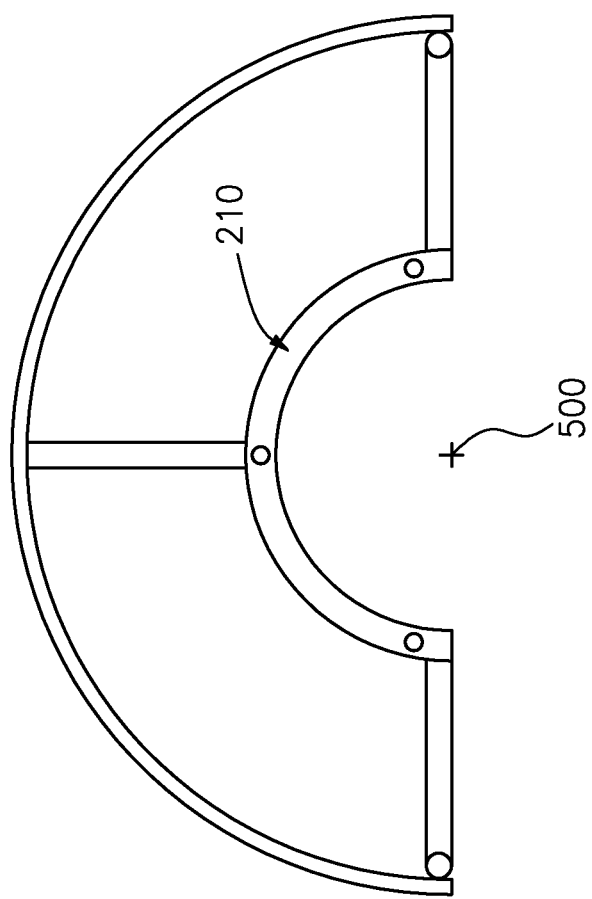
FIG. 11 is a partially schematic end view of an inner hood member.

FIG. 6 shows further details of the inner hood 144 and carrier 80. FIG. 6 shows the outer sting shaft 90 extending to an inboard end 200 and having an inner/inboard surface 202 and an outer/outboard surface 203. An end flange 204 may be mounted to the outer shaft 90 at the end 200 (e.g., via welding). The flange 204 carries a plurality of studs or bungs 206 (e.g., having respective axes 510 parallel to and spaced apart from the axis 500). In the exemplary implementation, the bungs have root portions that extend through apertures 208 in a mounting ring segment 210 (also FIG. 11). The exemplary ring segment 210 joins the struts 180, 181, 182 at inboard ends thereof. For example, the inboard ends of the struts may be welded to the ring 210 at their inboard ends and welded to the hood at their outboard ends.

Each exemplary bung 206 (FIG. 7) may have a proximal root portion 220 secured to the flange 204 (e.g., press-fit or welded into an aperture 222). Each exemplary bung has an intermediate portion 224 received within the aperture 208. A distal portion 230 of the bung may protrude beyond an inboard face of the ring 210 and may bear features for engaging a fastener component to resist extraction/removal of the inner hood from the sting. In an exemplary embodiment, the portion 230 bears a groove 232 which can receive a wedge clip 234 (e.g., having a generally U-shaped body 240 (FIG. 8) and a locking wire 242 having end portions 244 received in holes 246 in the legs of the U). The groove may be received in the clip and the latch closed to prevent axial removal of the hood. The exemplary clip, however, allows the user to manually disengage the latch and remove the clip whereafter the user can manually extract the hood from the outer sting. An installation of the hood may be via a reverse of this process. This allows the inner hood to be removed and replaced without use of tools.

Returning to FIG. 6, the exemplary inner sting shaft 92 extends to an inboard end 250. A mounting flange 252 is secured to the inboard end (e.g., via welding). A receiver 254 for the carrier may be mounted to the mounting flange. For example, the receiver may have its own mounting flange 256 mounted to the flange 252 via fasteners such as bolts 258. A receiver body 258 receives an end portion 260 of a main shaft 262 of the carrier.

Figure 9:
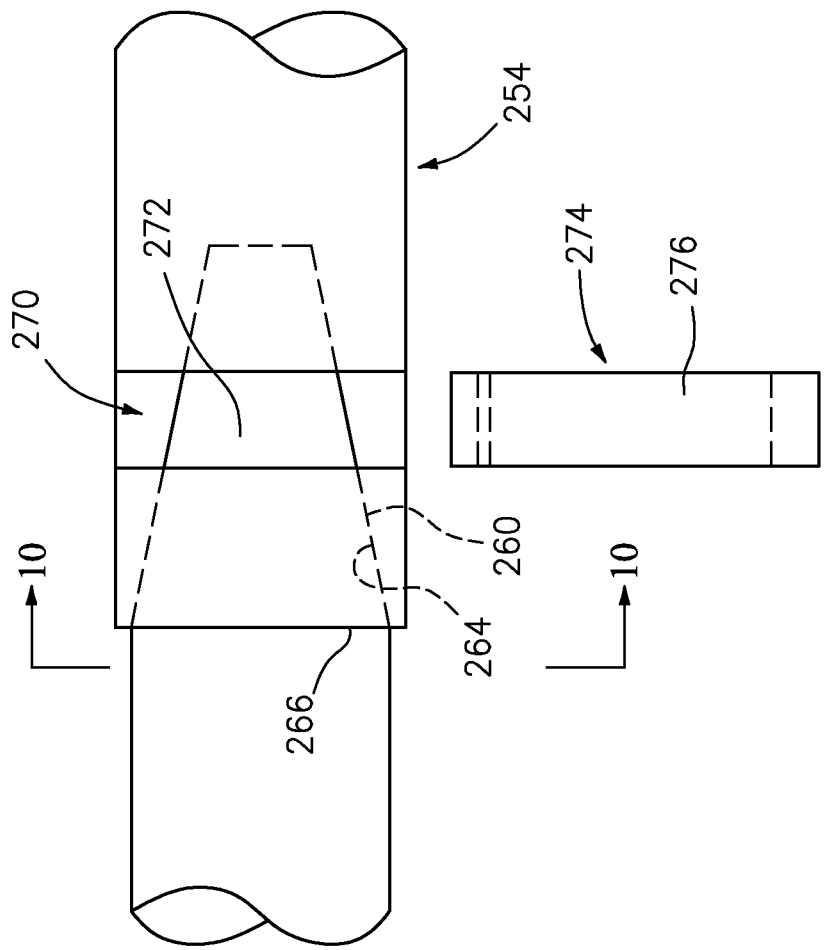
FIG. 9 is an enlarged partially schematic view of a carrier-mounting arrangement of the system of FIG. 2.
Figure 10:
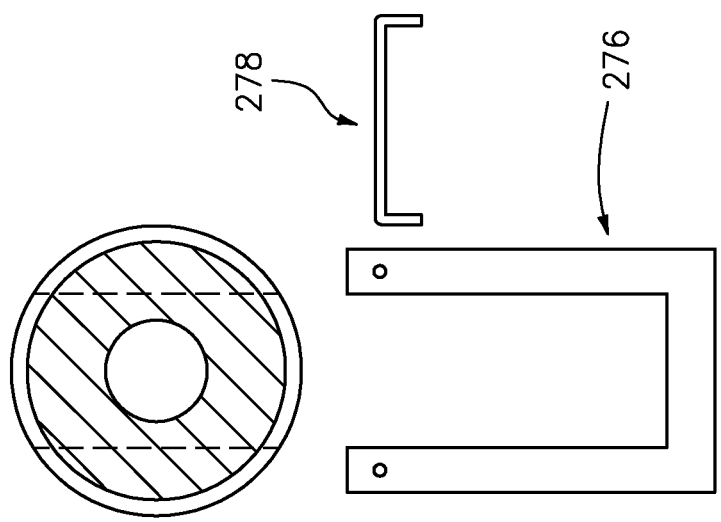
FIG. 10 is a partially schematic transverse cutaway view of the arrangement of FIG. 9.

FIG. 9 shows the receiver body 258 as having a socket or compartment 264 having a generally frustoconical taper complementary to a taper of the end portion 260. The compartment extends and is open to an end 266 of the receiver body. With the end portion 260 in its installed position, the receiver body and end portion have circumferential chordways grooves 270 and 272 which are axially aligned with each other. A clip 274 having a body 276 may engage the grooves to maintain axial and circumferential positions of the shaft end portion 260 and body 258. The clip may also have a locking wire 278 (FIG. 10) as described above. The clip can allow the carrier to be installed and removed without tools. The exemplary carrier has a pair of end plates 280 and 282 mounted to the shaft 262 near the opposite ends thereof. The plate 280 is relatively near the end 260. One or both these plates may carry fixture elements for holding the individual parts or groups thereof. In the illustrated embodiment, the parts are blades, having airfoils 300 extending from a tip 302 to a platform 304. An attachment root 306 depends from the underside of the platform. Exemplary fixture elements comprise a firtree receptacle 310 for receiving the root 306. A shaft 312 extends from the receptacle through an associated aperture 314 in the plate 280. The exemplary shaft may freely rotate about an axis 520 so that as the carrier rotates about its axis 500, the parts maintain their orientations.

FIG. 6 also shows the manifold 56 formed as a pair of tubular sections or conduits 320 (e.g., of a similar material to that of the sheet that forms a body of the hood) mounted to the hood (e.g., via welding) adjacent the respective edges 162 and 163. An exemplary tubular section 320 has a closed distal end 322 and a longitudinal array of venting apertures or outlets 324. At a proximal end, the tube may bear a fitting 330 (FIG. 7) which mates with a conduit extending from the source 55 of FIG. 2. For example, line 57 of FIG. 2 may discharge to the annular space between the inner and outer sting shafts. An additional line 334 may pass from this annular space into a port in one face of the flange 204 which aligns with a port in the opposite face that receives the fitting 330. Seal 332 may block the end of the annular space between sting members.

FIG. 12 shows the inner hood 144 as having an array of apertures 360. A size of the aperture is 1-5 mm (e.g., diameter for a circular aperture or average transverse dimension for others), more narrowly, 1.5-3.5 m. The exemplary apertures form an exemplary 20-70% of the surface area of the hood, more narrowly, 40-60%. The exemplary apertures may be formed as circular apertures by drilling. Alternative apertures may be formed electrical discharge machining (EDM), punching, and/or stamping. A screen material or expanded material could also be used. FIG. 13 shows the outer hood as having a single venting slot as described above. The total area of the slot is 550-800 cm², more narrowly, 300-1270 cm². FIG. 14 shows a group of slots circumferentially arrayed. Tubular features 370 at the edges of the hood in FIGS. 13 and 14 are the gas manifolds that are fed from an external gas (e.g., oxygen) source (e.g., 55 of FIG. 2 or a separate source) via ports (not shown) on the chamber wall.

The exemplary sequence of operation may start with the outer hood installed in the deposition chamber 42 and the deposition chamber pumped down to appropriate pressure conditions and heated to appropriate temperature conditions. Similarly, the preheat chamber may be heated to initial conditions. The end of the inner sting may initially be in the loading chamber without the carrier or inner hood. Parts may be pre-installed onto a carrier and several carriers may be used sequentially to speed production. The pre-loaded carrier may be installed to the inner sting shaft 92 and secured as discussed above. The inner hood may then be installed. The door 120 may be closed and the load lock pumped down to an appropriate condition whereafter the gate valve 64 is opened and the sting shaft assembly inserted to move the carrier into the preheat chamber 60. In appropriate preheating and any further pumped down, the gate valve 62 may be opened and the carrier inserted into the deposition chamber and the coating process commenced. After completion of the coating process, the carrier may be retracted back into the preheat chamber and the gate valve 62 closed. In that extraction or after closing the gate valve 62, the carrier may be further extracted into the loading chamber 72. The gate valve 64 may be closed and the loading chamber 72 vented to atmosphere. Thereafter, the door 120 may be opened. In a first exemplary implementation, the hood inner member is removed at this point in every such extraction. It may further be discarded and/or cleaned or otherwise reconditioned before reuse. Thus, there may be several or many individual inner hood members sequentially used. The carrier may be removed and replaced with a fresh carrier (e.g., pre-loaded with parts). In other implementations, the inner hood member may either not be removed for several cycles or may be replaced without reconditioning for those several cycles, replacement may be at a much more frequent interval than would otherwise be done with a single fixed hood.

The various such replacement cycles may allow for some combination of group uniformity, reduced cycle time, and reduced cost. For example, a full replacement of a fixed hood with each cycle or few cycles would entail the cost of the substantial hood but also would create equipment downtime during cooling and venting of the deposition chamber and subsequent pump down and heating. When compared with a baseline system having a fixed hood, if the interval for replacing the inner member is substantially shorter than the interval for replacing the single fixed hood, consistency may improve because the hood inner member may become less fouled during such interval than the single hood during its interval.

One or more embodiments have been described. Nevertheless, it will be understood that various modifications may be made. For example, and applied as a reengineering of an existing coating apparatus and process, details of the existing apparatus and/or process (in view of the particular coating and substrate) may influence or dictate details of any particular implementation. Accordingly, other embodiments are within the scope of the following claims.

What is claimed is:

1. An apparatus for depositing a coating on a part, the apparatus comprising:
   a chamber;
   a sting assembly for carrying the part and shiftable between:
      an inserted condition where the sting assembly holds the part within the chamber for coating; and
      a retracted condition where the sting assembly holds the part outside of the chamber;
   a source of the coating material, positioned to communicate the coating material to the part in the inserted condition;
   a thermal hood comprising a first member and a second member wherein:
      the second member is between the first member and the part when the part is in the inserted condition; and
      the second member is carried by the sting assembly so as to retract with the sting assembly as the sting assembly is retracted from the inserted condition to the retracted condition.

2. The apparatus of claim 1 wherein:
the source comprises an ingot and an electron source positioned to direct a beam to the ingot.

3. The apparatus of claim 1 wherein:
the first member and the second member are concentric shells.

4. The apparatus of claim 1 wherein:
the first member is mounted to the chamber so as to remain stationary as the sting assembly is moved between the retracted condition and the inserted condition.

5. The apparatus of claim 1 wherein:
the first member comprises a nickel-based superalloy; and
the second member comprises a nickel-based superalloy.

6. The apparatus of claim 1 wherein:
the first member comprises a bent sheet.

7. The apparatus of claim 1 wherein:
the second member comprises a perforated bent sheet.

8. The apparatus of claim 1 wherein:
the sting assembly comprises:
   an inner member and an outer member; and
   an actuator coupled to the inner member to rotate the inner member relative to the outer member, and wherein:
      the part is held by the inner member and the thermal hood second member is held by the outer member.

9. The apparatus of claim 8 wherein:
the thermal hood second member is attached to the sting outer member by a plurality of struts at a first end of the thermal hood second member.

10. The apparatus of claim 1 wherein:
the second member comprises a metallic body having a plurality of apertures.

11. The apparatus of claim 10 wherein:
the second member is part of a thermal hood liner further comprising:
   means for mounting the metallic body to the sting assembly.

12. The apparatus of claim 11 wherein:
the metallic body comprises a nickel-based superalloy sheet;
the apertures comprise drilled holes; and
the means comprise a plurality of radial struts at only one end of the metallic body.

13. The apparatus of claim 10 wherein:
the metallic body comprises a nickel-based superalloy sheet; and the apertures comprise drilled holes.

14. The apparatus of claim 1 wherein:
the second member further comprises:
at least one gas conduit having a plurality of outlets.

15. The apparatus of claim 14 wherein:
the at least one gas conduit is coupled to a gas source via the sting assembly.

16. A method for using the apparatus of claim 1, the method comprising:
coating a first said part;
after the coating, retracting the sting assembly from the inserted condition to the retracted condition to retract the first part from the chamber;
replacing the first part with a second said part and replacing the thermal hood second member with a replacement thermal hood second member;
inserting the second part and the replacement thermal hood second member into the chamber; and
coating the second part.

17. The method of claim 16 wherein:
the thermal hood first member remains in place in the chamber during the coating of the first part and the coating of the second part.

18. The method of claim 16 wherein the chamber is a deposition chamber and the apparatus further comprises:
a loading chamber; and
a preheat chamber between the deposition chamber and the loading chamber, the retracting comprising retracting the first part into the loading chamber through the preheat chamber.

19. The method of claim 16 wherein:
during coating, the part being coated is rotated relative to the thermal hood second member.

20. The method of claim 16 wherein:
the coating passes to the part being coated as a vapor.

* * * * *